United States Patent
Haywood

(10) Patent No.: US 11,804,277 B2
(45) Date of Patent: Oct. 31, 2023

(54) ERROR REMAPPING

(71) Applicant: Rambus Inc., San Jose, CA (US)

(72) Inventor: Christopher Haywood, Cary, NC (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 17/722,667

(22) Filed: Apr. 18, 2022

(65) Prior Publication Data

US 2022/0310191 A1 Sep. 29, 2022

Related U.S. Application Data

(63) Continuation of application No. 16/823,908, filed on Mar. 19, 2020, now Pat. No. 11,335,430.

(60) Provisional application No. 62/823,790, filed on Mar. 26, 2019.

(51) Int. Cl.
| | |
|---|---|
| *G11C 29/44* | (2006.01) |
| *G11C 29/18* | (2006.01) |
| *G11C 29/12* | (2006.01) |
| *G11C 7/22* | (2006.01) |
| *G11C 29/00* | (2006.01) |

(52) U.S. Cl.
CPC ............... *G11C 29/44* (2013.01); *G11C 7/22* (2013.01); *G11C 29/12015* (2013.01); *G11C 29/18* (2013.01); *G11C 29/702* (2013.01); *G11C 2029/1806* (2013.01)

(58) Field of Classification Search
CPC .................................................... G11C 29/44
See application file for complete search history.

(56) References Cited

U.S. PATENT DOCUMENTS

| | | | |
|---|---|---|---|
| 4,376,300 A * | 3/1983 | Tsang | G11C 29/76 714/3 |
| 5,164,944 A | 11/1992 | Benton et al. | |
| 5,838,893 A | 11/1998 | Douceur | |
| 5,883,842 A | 3/1999 | Miyauchi | |
| 5,905,858 A | 5/1999 | Jeddeloh | |
| 5,974,564 A | 10/1999 | Jeddeloh | |
| 5,978,953 A | 11/1999 | Olarig | |
| 6,003,144 A | 12/1999 | Olarig et al. | |
| 6,035,432 A | 3/2000 | Jeddeloh | |
| 6,085,339 A | 7/2000 | Jeddeloh | |
| 6,192,487 B1 | 2/2001 | Douceur | |
| 6,363,502 B1 | 3/2002 | Jeddeloh | |
| 6,973,613 B2 | 12/2005 | Cypher | |
| 6,976,194 B2 | 12/2005 | Cypher | |

(Continued)

*Primary Examiner* — Douglas King
(74) *Attorney, Agent, or Firm* — The Neudeck Law Firm, LLC

(57) ABSTRACT

Many error correction schemes fail to correct for double-bit errors and a module must be replaced when these double-bit errors occur repeatedly at the same address. This helps prevent data corruption. In an embodiment, the addresses for one of the memory devices exhibiting a single-bit error (but not the other also exhibiting a single bit error) is transformed before the internal memory arrays are accessed. This has the effect of moving one of the error prone memory cells to a different external (to the module) address such that there is only one error prone bit that is accessed by the previously double-bit error prone address. Thus, a double-bit error at the original address is remapped into two correctable single-bit errors that are at different addresses.

7 Claims, 9 Drawing Sheets

(56) References Cited

U.S. PATENT DOCUMENTS

| | | |
|---|---|---|
| 6,996,766 B2 | 2/2006 | Cypher |
| 7,080,305 B2 | 7/2006 | Welbon et al. |
| 7,562,285 B2 | 7/2009 | Wang et al. |
| 7,831,882 B2 | 11/2010 | Tsern et al. |
| 7,971,124 B2 | 6/2011 | Spanel et al. |
| 7,975,205 B2 | 7/2011 | Thayer |
| 8,020,053 B2 | 9/2011 | Warnes et al. |
| 8,205,146 B2 | 6/2012 | Brueggen |
| 8,352,805 B2 | 1/2013 | Shaeffer et al. |
| 8,397,134 B2 | 3/2013 | Lillestolen |
| 8,468,422 B2 | 6/2013 | Chessin et al. |
| 8,885,426 B1 | 11/2014 | Burstein et al. |
| 8,892,942 B2 | 11/2014 | Warnes et al. |
| 8,902,638 B2 | 12/2014 | Wang |
| 8,971,094 B2 | 3/2015 | Wang |
| 8,977,944 B2 | 3/2015 | Maheshwari et al. |
| 8,996,960 B1 | 3/2015 | Saxena et al. |
| 9,141,472 B2 | 9/2015 | Giovannini et al. |
| 9,195,607 B1 | 11/2015 | Saxena et al. |
| 9,218,243 B2 | 12/2015 | Shaeffer |
| 9,411,678 B1 | 8/2016 | Ware et al. |
| 9,450,614 B2 | 9/2016 | Ware et al. |
| 9,691,504 B2 | 6/2017 | Tsern et al. |
| 9,734,921 B2 | 8/2017 | Ware et al. |
| 9,785,500 B1 | 10/2017 | Ware et al. |
| 9,804,920 B2 | 10/2017 | Ping et al. |
| 9,823,966 B1 | 11/2017 | Ware et al. |
| 9,824,779 B2 | 11/2017 | Ware et al. |
| 9,836,348 B2 | 12/2017 | Ware et al. |
| 2004/0030856 A1 | 2/2004 | Qureshi et al. |
| 2007/0038800 A1 | 2/2007 | Lakhani et al. |
| 2008/0072116 A1* | 3/2008 | Brittain ......... G06F 11/073 714/758 |
| 2009/0040825 A1 | 2/2009 | Adusumilli et al. |
| 2009/0106479 A1 | 4/2009 | Okin et al. |
| 2010/0005281 A1 | 1/2010 | Buchmann et al. |
| 2010/0005366 A1 | 1/2010 | Dell et al. |
| 2014/0351673 A1 | 11/2014 | Ware et al. |

\* cited by examiner

ERROR REMAPPING

DETAILED DESCRIPTION OF THE EMBODIMENTS

Memory devices on memory modules (e.g., dual-inline memory modules—DIMMs) are typically tested to be 100% functional when manufactured. However, these memory devices may degrade over their lifetime and develop errors. When two (or more) bits at the same address develop errors, many popular error correction schemes fail to correct these double-bit errors and the module must be replaced to prevent data corruption. In an embodiment, the addresses for one of the memory devices exhibiting an error (but not the other) is transformed before the internal memory arrays are accessed. This has the effect of moving the error prone memory cell to a different external (to the module) address such that there is only one error prone bit that is accessed by previously double-bit error prone address. Thus, a double-bit error at the original address is remapped into two correctable single-bit errors that are at different addresses.

Figure 1:
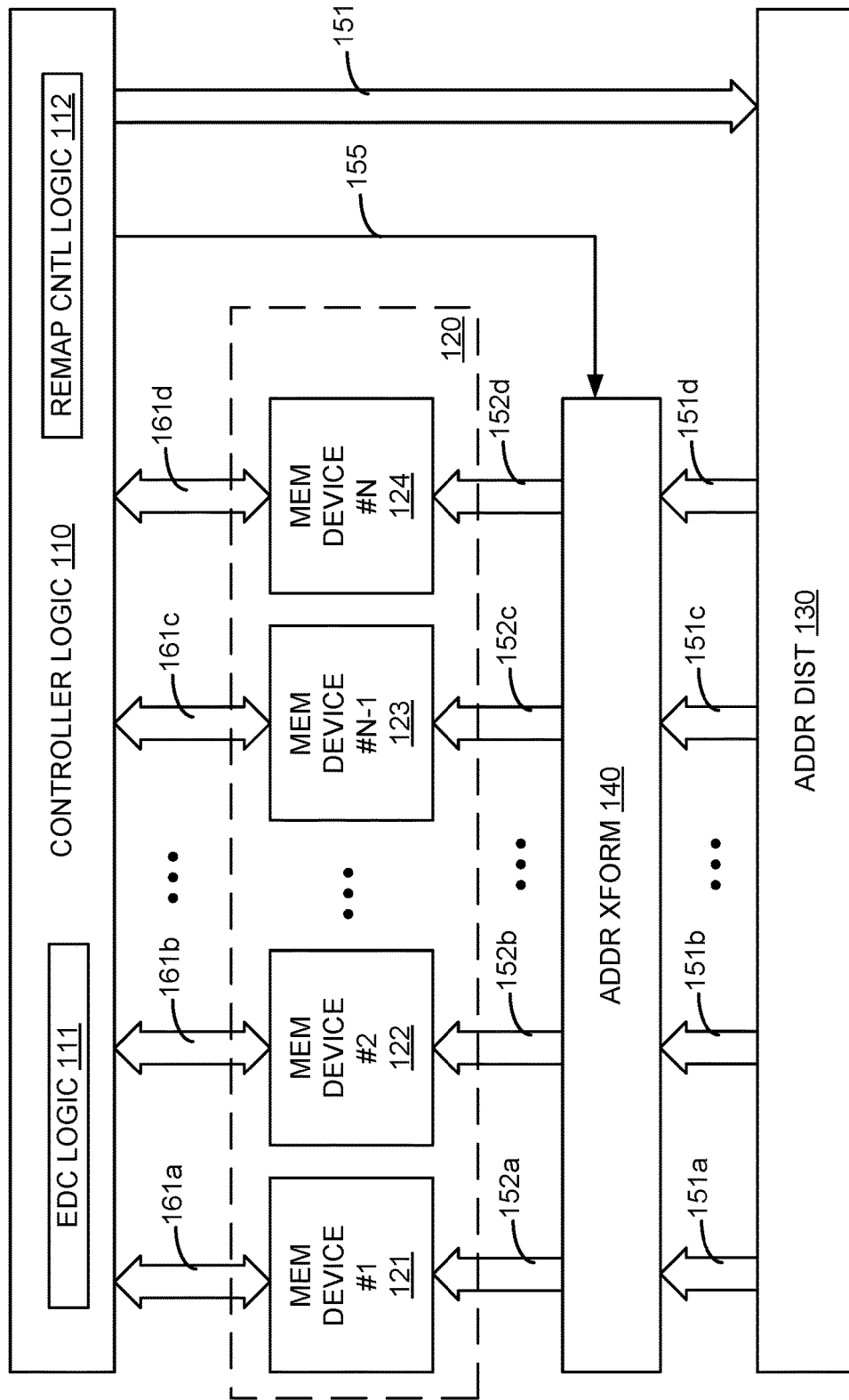
FIG. 1 is a block diagram of a memory system.

FIG. 1 is a block diagram of a memory system. In FIG. 1, memory system 100 comprises controller logic 110, memory devices 121-124, address distribution 130, and address transformation 140. Controller logic 110 include error-detect-correct (EDC) logic 111 and remap control logic 112. Memory devices 121-124 may be disposed on a module 120.

In an embodiment, controller logic 110 outputs addresses 151 to address distribution 130. Address distribution 130 provides a plurality of addresses (e.g., 2, 8, 9, etc.) 151a-151d to address transformation 140. Address transformation 140 can be configured to provide one or more transformed addresses 152a-152d to respective memory devices 121-124. Based on the received addresses 152a-152d, memory devices 121-124 access their respective internal memory arrays. These accesses may include precharge, activate, read, and write, etc. commands. Data 161a-161d is coupled between memory devices 121-124 and controller logic 110. In the case of a read command, the data 161a-161d read from memory devices 121-124 may be checked by EDC logic 111. EDC logic 111 may also correct, for example, single bit errors in the data 161a-161d received from memory devices 121-124.

Controller logic 110 may also determine, using EDC logic 111, that a double-bit (or more) error occurred in the data 161a-161d at a given address. Over multiple accesses, controller logic 110 may determine that the double-bit (or more) error reoccurs at that given address. Controller 110 may determine that each of the single-bit errors that comprise the double-bit (or more) reoccurring error come from different memory devices. Based on determining that the single-bit errors are associated with different memory devices, remap control logic 112 of controller logic 110 may configure (e.g., using link 155) address transform 140 to transform the address 152a-152d received by some of the memory devices 121-124 associated with the double bit error (but not all of the memory devices associated with the double-bit, or more, error.) This transformation causes the memory devices 121-124 receiving the changed address 151a-152d to access different internal memory cells than were accessed when memory device 121-124 receive an untransformed address. Thus, the changed address(es) can be configured to "move" one (or more) of the single-bit errors at the double-bit (or more) error address to a different address(es), thereby reducing the number of erroneous bits down to a correctable number of errors.

In an embodiment, address distribution 130 is internal to controller logic 110 and provides multiple copies of the same address 151a-151d value to address transformation 140. In another embodiment, address distribution 130 may comprise a point to multi-point connection arrangement (e.g., star network, fly-by network, etc.) that provides the multiple copies of the same address to address transformation 140 circuitry. In another embodiment, address distribution may be a registered clock driver (RCD), located on module 120, that provides one copy of the address (e.g., 152a-152b) to some of the memory devices (e.g., 121-122) and another copy of the address (e.g., 152c-152d) to the rest of the memory devices (e.g., 123-124).

When configured to transform addresses, address transformation 140 may make transformations such as, for example: inverting one or more bits of the received addresses (e.g., one or more of 151a-151d); re-ordering to or more bits of the received addresses (e.g., exchange A[0] with A[1]); or both. Other transformations may be used either alone or in combination.

In FIG. 1, address distribution 130 and address transformation 140 are illustrated as being outside of controller logic 110, module 120, and memory devices 121-124. This is merely for the sake of illustrating the concepts relating address distribution 130 and address transformation 140 (e.g., that address translation may be accomplished after address distribution is accomplished.) It should be understood that address distribution 130 may, in some embodiments, be part of controller logic 110, module 120, memory devices 121-124, and/or other circuitry and/or wiring not illustrated in FIG. 1. Likewise, it should be understood that address transformation 140 may, in some embodiments, be part of controller logic 110, module 120, memory devices 121-124, and/or other circuitry and/or wiring not illustrated in FIG. 1.

In an embodiment, controller logic 110 may be part of a module manufacturing test scheme and the remapping is configured at the manufacturer of module 120. In another embodiment, controller logic 110 may be part of a system manufacturing test scheme and the remapping is configured at the system 100 manufacturer or test. In another embodiment, controller logic 110 may be part of a system (e.g., PC, server, mobile device, etc.) that includes memory system 100 and the remapping is configured at boot time, system recalibration, and/or maintenance event. The process of selection which transformation/remapping is to be used (e.g., which one or more bits to invert), may be an iterative process to establish optimized rank performance and lowest correctable error rate.

Figure 2A:
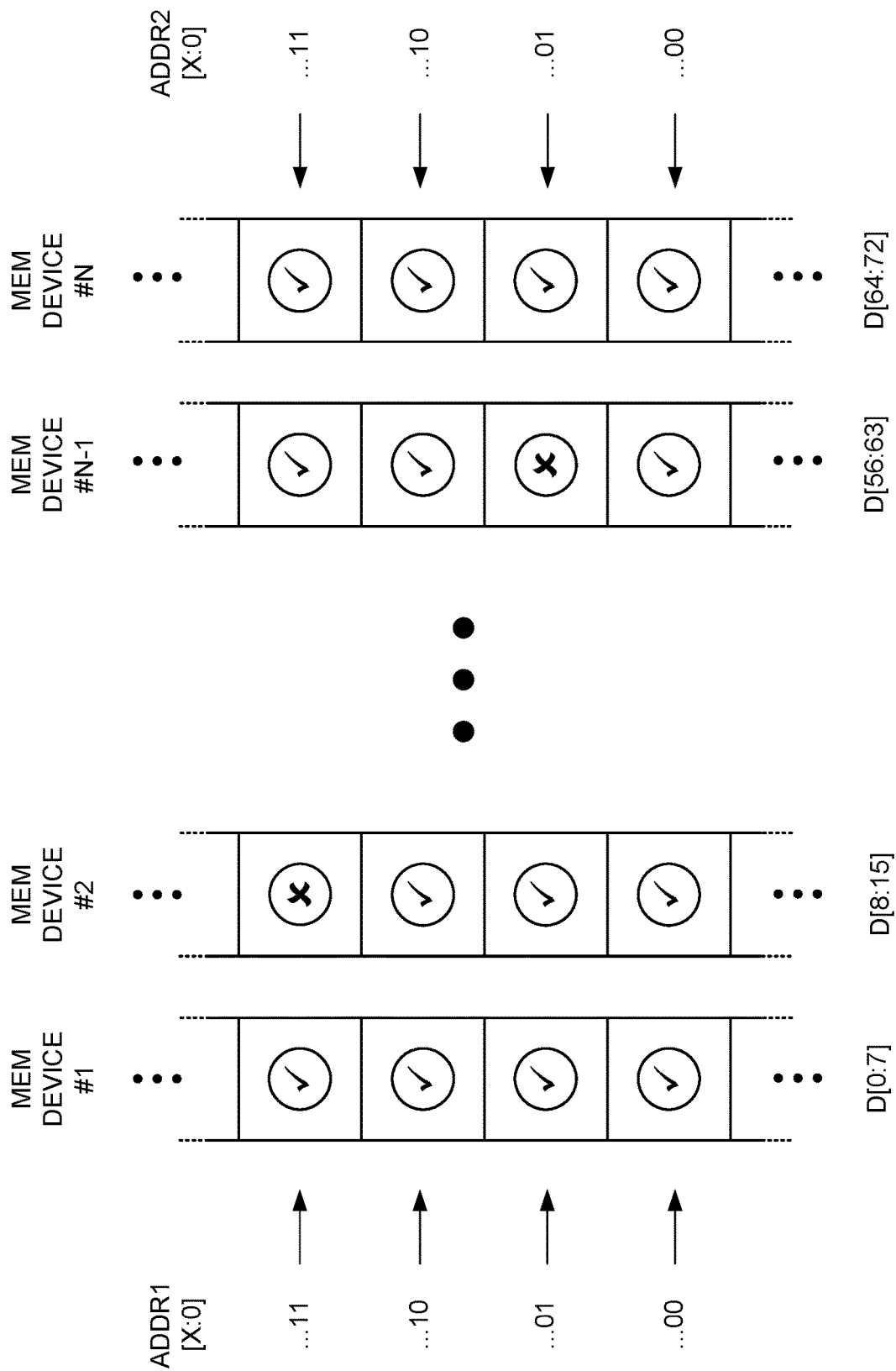
FIGS. 2A-2C illustrates remapping a double-bit error into correctable single-bit errors.
Figure 2B:
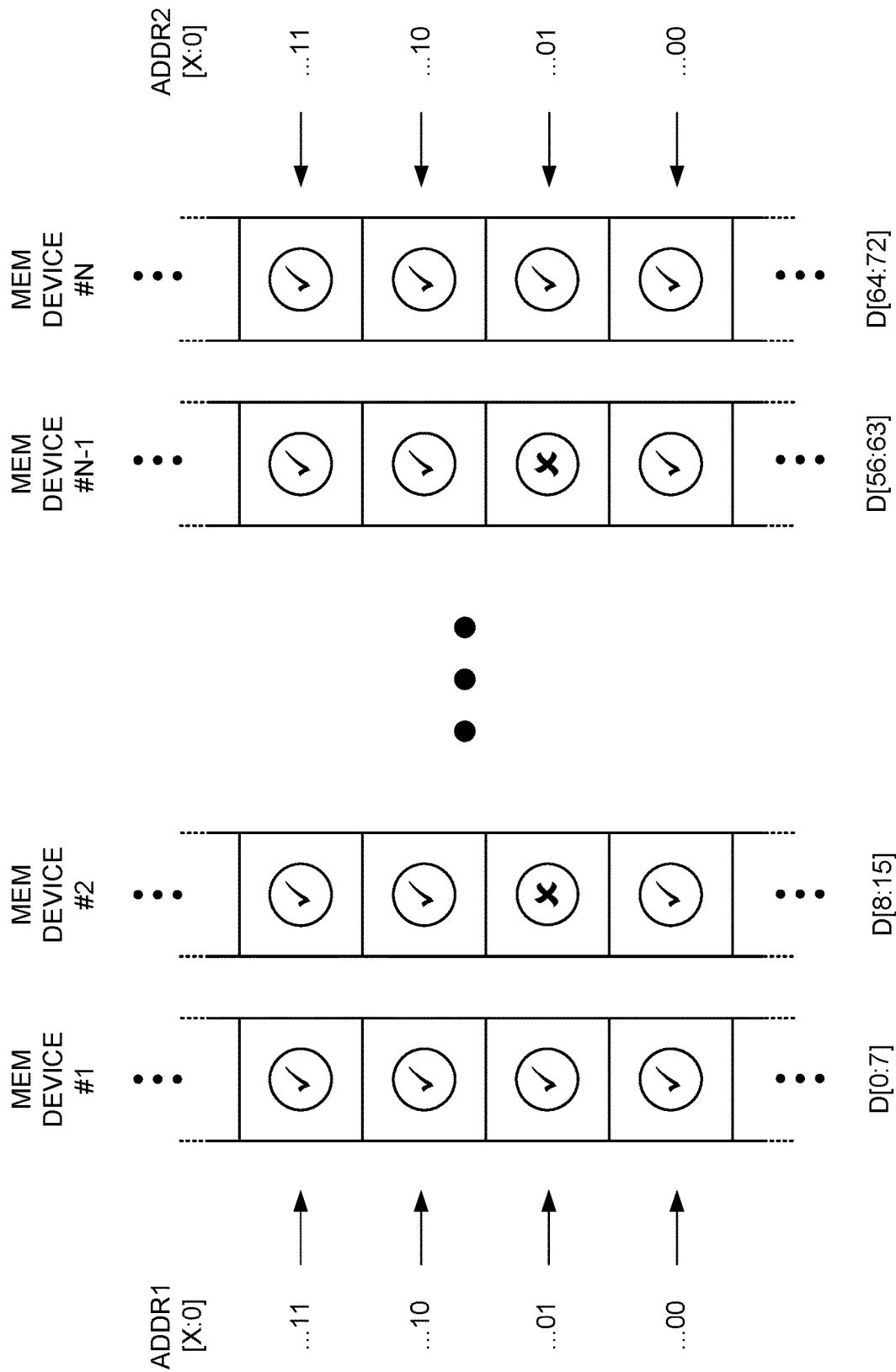
Figure 2C:
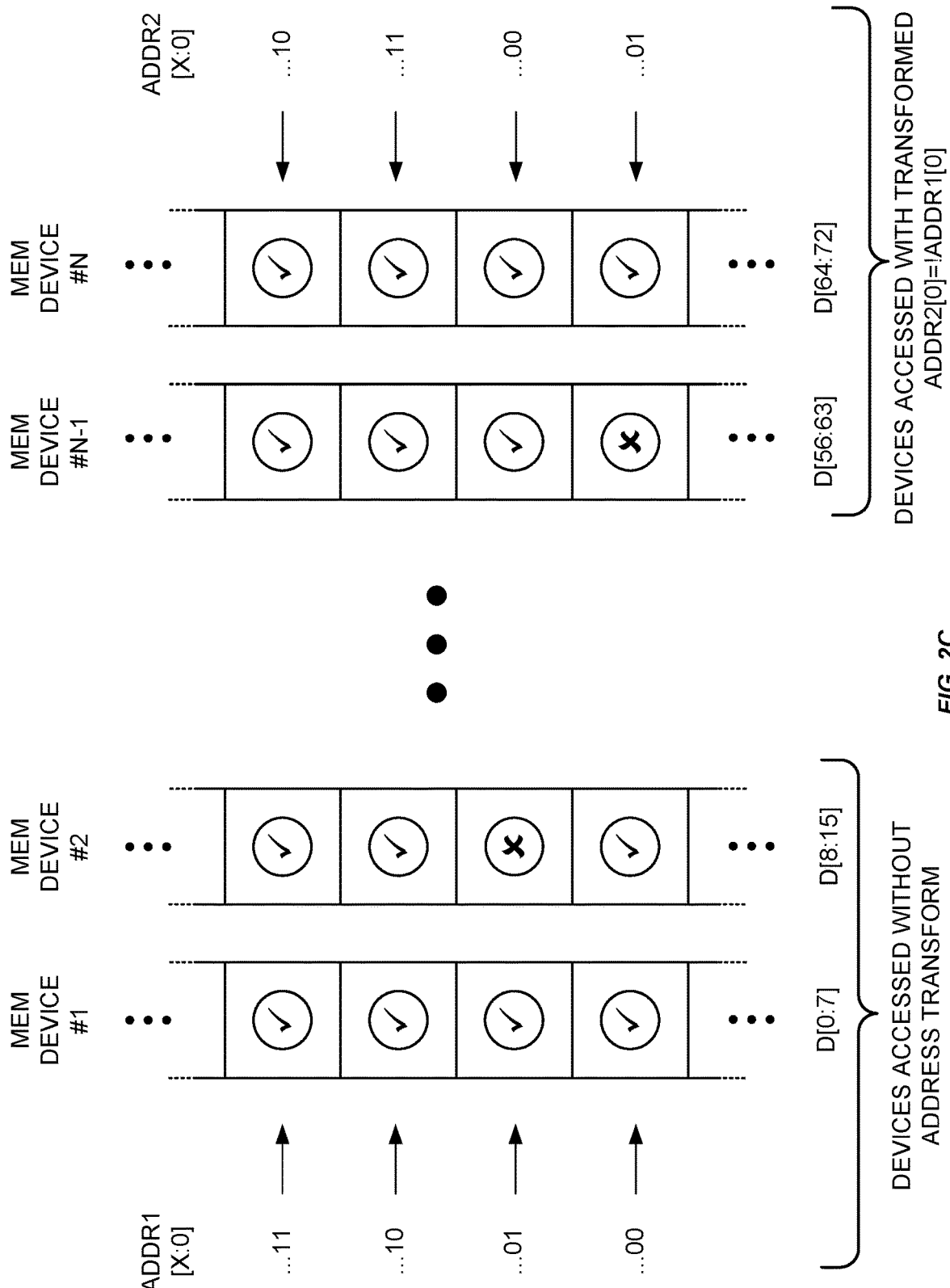

FIGS. 2A-2C illustrates remapping a double-bit error into correctable single-bit errors. The remapping illustrated in FIG. 2A-2C may be applicable to memory devices 121-124 that also store error-detect-correct information in a system that is capable of detecting and correcting single-bit errors, and capable of detecting but not necessarily correcting double-bit errors. FIG. 2A illustrates a single-bit error at address [ . . . 11] of memory device #2 (e.g., memory device 122) and the rest of the data (e.g., 161a, 161c-161d) from the other memory devices (e.g., memory devices 121, 123-124) being correct data. FIG. 2A also illustrates another single-bit error at address [ . . . 01] of memory device #N−1 (e.g., memory device 123) and the rest of the data (e.g., 161a-161b, 161d) from the other memory devices (e.g., memory devices 121, 123-124) being correct data. Because these two single-bit errors are at different addresses, when the memory devices are accessed using the same address, these two single-bit error are each correctable.

FIG. 2B illustrates a single-bit error at address [ . . . 01] of memory device #2 (e.g., memory device 122), another single-bit error at address [ . . . 01] of memory device #N−1 (e.g., memory device 123) and the rest of the data from the other memory devices being correct data. Thus, the whole of the data retrieved from memory devices 121-124 at address [ . . . 01] includes a double-bit error. Thus, address [ . . . 01] has an uncorrectable double-bit error.

FIG. 2C also illustrates a single-bit error at address [ . . . 01] of memory device #2 (e.g., memory device 122), another single-bit error at address [ . . . 01] of memory device #N−1 (e.g., memory device 123) and the rest of the data from the other memory devices being correct data. However, in FIG. 2C, the addresses provided to the internal memory cells of (at least) memory device #N−1 (the location of one of the single-bit errors) has been transformed by inverting the least significant bit of the address. The address provided to (at least) memory device #2 (the location of the other of the single-bit errors) has not been transformed (or at least not transformed in the same manner.) Thus, when memory device #2 retrieves data from the address [ . . . 01] that has a malfunction causing a single-bit error, memory device #N−1 retrieves data from address [ . . . 00] that is not malfunctioning. Thus, only the correctable single-bit error from memory device #2 is received by controller logic when location [ . . . 01] or location [ . . . 00] is accessed.

Figure 3:
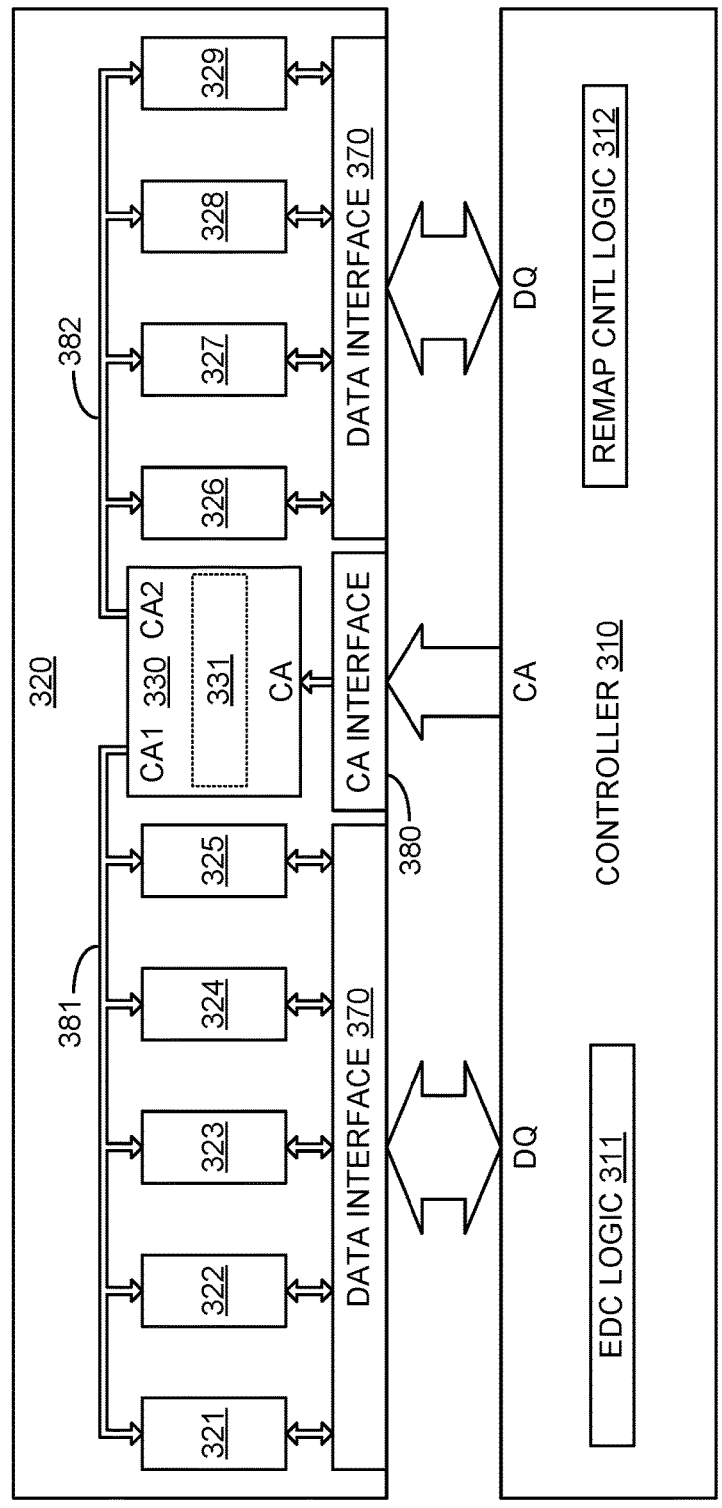
FIG. 3 illustrates a registered memory module error remapping memory system.

FIG. 3 illustrates a registered memory module error remapping memory system according to an embodiment. In FIG. 3, memory system 300 comprises controller 310 and module 320. Controller 310 is operatively coupled to module 320 via data signals (DQ) and command-address signals (CA). Module 320 includes memory components 321-329, buffer 330, data interface 370, and command-address interface 380. Command-address interface 380 is operatively coupled to buffer 330. Buffer 330 includes address transform 331. Buffer 330 is operatively coupled to memory components 321-325 via secondary command-address signals CA1 381 (also referred to as CA bus 381). Buffer 330 is operatively coupled to memory components 326-329 via secondary command-address signals CA2 382 (also referred to as CA bus 382). Buffer 330 may also be referred to as a command/address (CA) Register. Thus, module 320 may be considered to be a registered module, or Registered Dual Inline Memory Module (R-DIMM).

Controller 310 and memory components 321-329 may be integrated circuit type devices, such as are commonly referred to as a "chips". A memory controller, such as controller 310, manages the flow of data going to and from memory devices and/or memory modules. Memory components 321-329 may be standalone devices, or may include multiple memory integrated circuit dies—such as components of a multi-chip module. A memory controller can be a separate, standalone chip, or integrated into another chip. For example, a memory controller may be included on a single die with a microprocessor, or included as part of a more complex integrated circuit system such as a block of a system on a chip (SOC).

Buffer 330 is operatively coupled to CA interface 380 and memory components 321-329 to reduce the electrical loading placed on the CA signals from controller 310. Buffer 330 helps isolate the electrical loading of the on-module DRAM memory components 321-329 from the command-address channel coupled to controller 310. Without buffer 330, the aggregate load of memory components 321-329 would degrade the achievable signaling rate of the command-address channel and hence the overall bandwidth performance of the memory subsystem. In an embodiment, all command-address traffic sent between controller 310 and memory components 321-329 is first received by buffer 330 via CA interface 380 (also referred to as CA bus 380).

Controller 310 may determine, using EDC logic 311, that a double-bit error occurred in the data at a given address. Over multiple accesses, controller 310 may determine that the double-bit error reoccurs at that given address. Controller 310 may determine that each of the single-bit errors that comprise the double-bit reoccurring error come from memory devices connected to different secondary CA busses 381-382. Based on determining that the single-bit errors are associated with different secondary CA busses 381-382, remap control logic 312 of controller 310 may configure (e.g., using CA bus 380 or a side-channel) address transform 331 of buffer 330 to transform the address sent via one of the secondary CA busses 381-382 (e.g., sent to memory devices 326-329 via CA bus 382) and not transform the address sent via the other of the secondary CA busses 381-382 (e.g., sent to memory devices 321-325 via CA bus 381). This transformation causes the memory devices (e.g., memory devices 326-329) receiving the changed address to access different internal memory cells than are accessed by the memory devices (e.g., memory devices 321-325) receiving an untransformed address. Thus, the changed addresses are configured to "move" one of the single-bit errors at the double-bit error address to a different address thereby reducing the number of erroneous bits at that address down to a correctable single-bit error.

When configured to transform addresses, address transform 331 may make transformations such as, for example: inverting one or more bits of the addresses received from CA bus 380; re-ordering to or more bits of the addresses received from CA bus 380 (e.g., exchange A[0] with A[1]); or both. Other transformations of the addresses received from CA bus 380 may be used either alone or in combination. In an embodiment, address transform 331 may apply transformations to the addresses sent via both CA bus 381 and CA bus 382 provided that the transformations are not identical.

In FIG. 3, a single CA interface 380 and two sets of secondary CA signals 381-382 are illustrated. It should be understood however, that in some embodiments, buffer 330 may receive independent CA signals over two respective independent CA interfaces. These sets independent CA signals may be received, for example, on opposite sides of module 320. In another example, these sets of independent CA signals may be time or otherwise multiplexed with each other on the same set of signal traces. Buffer 330 may receive each the two sets of independent CA signals and drive each the two sets of CA signals, respectively, to two secondary CA signal sets (i.e., two channels from a host to 4 CA channels, where each DRAM channel includes a set of 4 or 5 DRAMs—two DRAM channels on the right and two DRAM channels on the left.)

Figure 4:
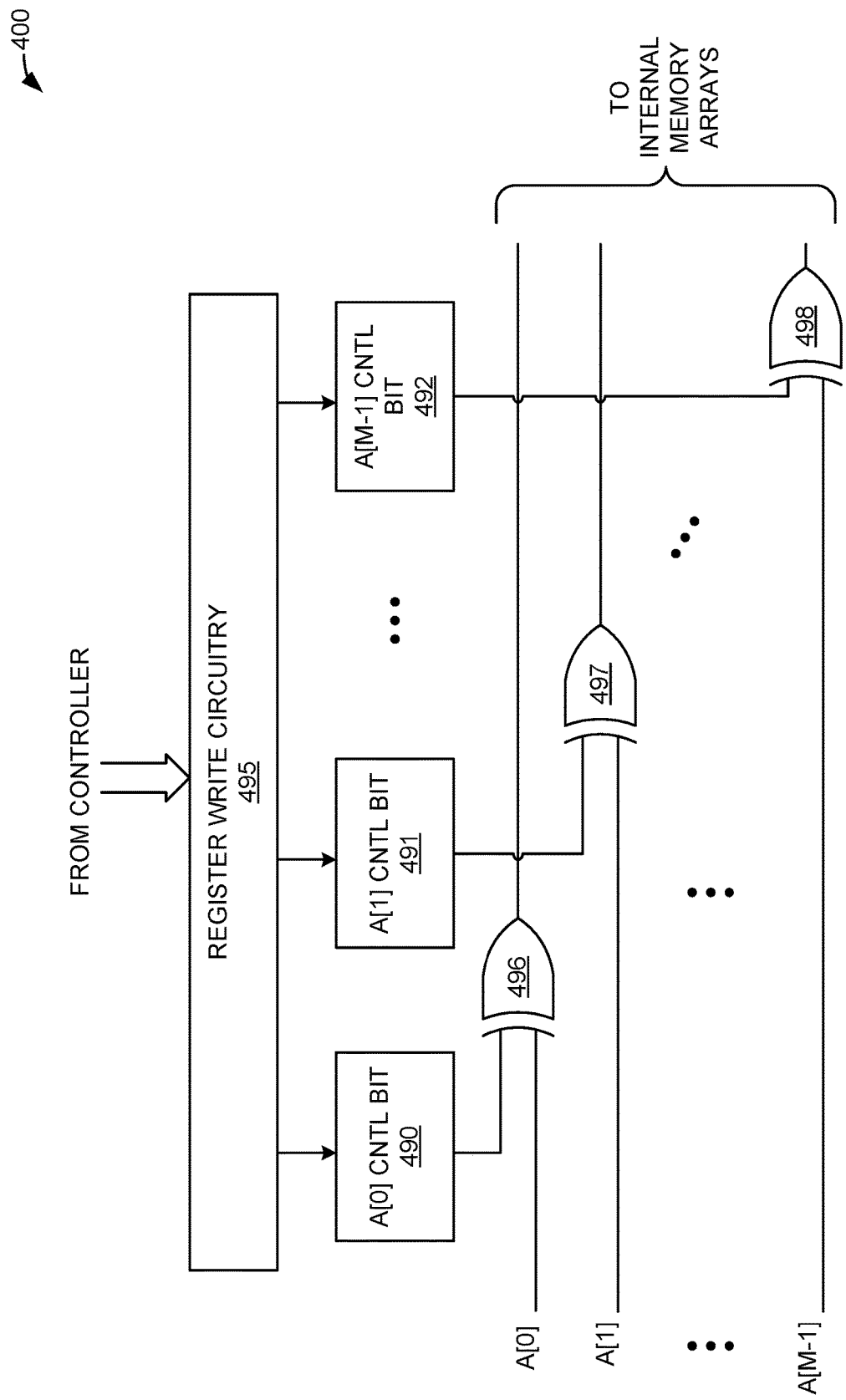
FIG. 4 illustrates example circuitry to transform memory addresses.

FIG. 4 illustrates example circuitry to transform memory addresses. The circuitry illustrated in FIG. 4 may be used by, for example, address transform 140, and/or address transform 331. Transform circuitry 400 receives information from a controller (e.g., controller 310) that is written to control bits 490-492 by register write circuitry 495. This information may be written using, for example, a mode register set command. In another example, a side-channel interface may be used to write control bits 490-492.

Control bits 490-492 supply their stored values to one input of exclusive-OR (XOR) gates 496-498, respectively. The other inputs to XOR gates 496-498 receive address bits A[0]-A[M−1], respectively. The outputs of XOR gates 496-498 are supplied as the transformed address bits. Thus, when the value supplied (i.e., stored) by given control bit 490-492 presents a logical '0' to the input of a respective XOR gate 496-498, that address bit is not inverted. However, when given control bit 490-492 presents a logical '1' to the input of a respective XOR gate 496-498, that address bit is inverted. Accordingly, a controller may configure the transformation of selected address bits A[0]-A[M−1] by writing respective selected values to respective control bits 490-492.

Figure 5:
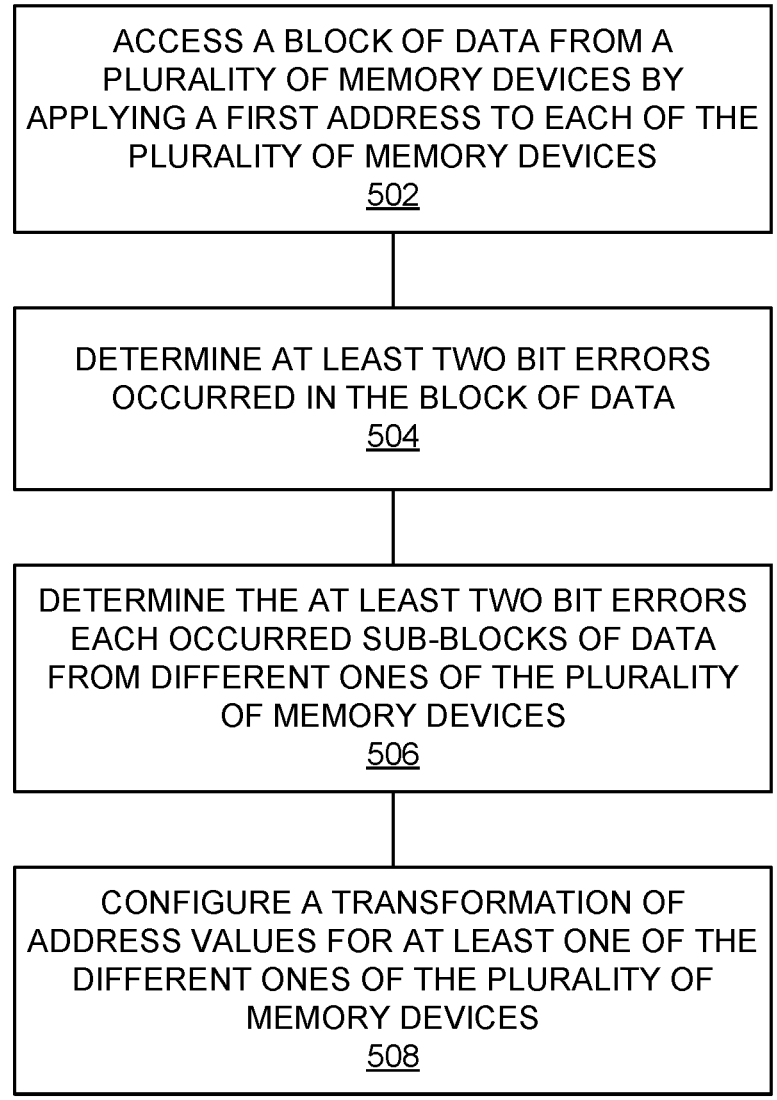
FIG. 5 is a flowchart illustrating a method of remapping errors.

FIG. 5 is a flowchart illustrating a method of remapping errors. The steps illustrated in FIG. 5 may be performed by one or more of memory system 100, memory system 300, and/or their components. A block of data from a plurality of memory devices is accessed by sending a first address to each of the plurality of memory devices (502). For example, controller 310 may access a block of data from memory devices 321-329 using a first address that is received by CA bus 380 (unchanged) and distributed by buffer 320 to memory devices 321-329 via secondary CA bus 381 and secondary CA bus 382.

It is determined that at least two bit errors occurred in the block of data (504). For example, controller 310 may determine, using EDC logic 311, that a double-bit (or more) error occurred in the data retrieved from the first address. Over multiple accesses, controller 310 may determine that the double-bit (or more) error reoccurs at the first address.

It is determined that the at least two bit errors each occurred in sub-blocks of data that are from different ones of the plurality of memory devices (506). For example, controller 310 may determine that each of the single-bit errors that comprise the double-bit (or more) reoccurring error at the first address come from different memory devices 321-329.

A transformation of address values for at least one of the different ones of the plurality of memory devices is configured (508). For example, controller 310 may configure (e.g., using CA bus 480) one or more address transform 331 of buffer 330 to transform the address received via CA bus 480, and distributed to CA bus 381 and configure address transform 331 to not transform the address distributed to CA bus 382.

Figure 6:
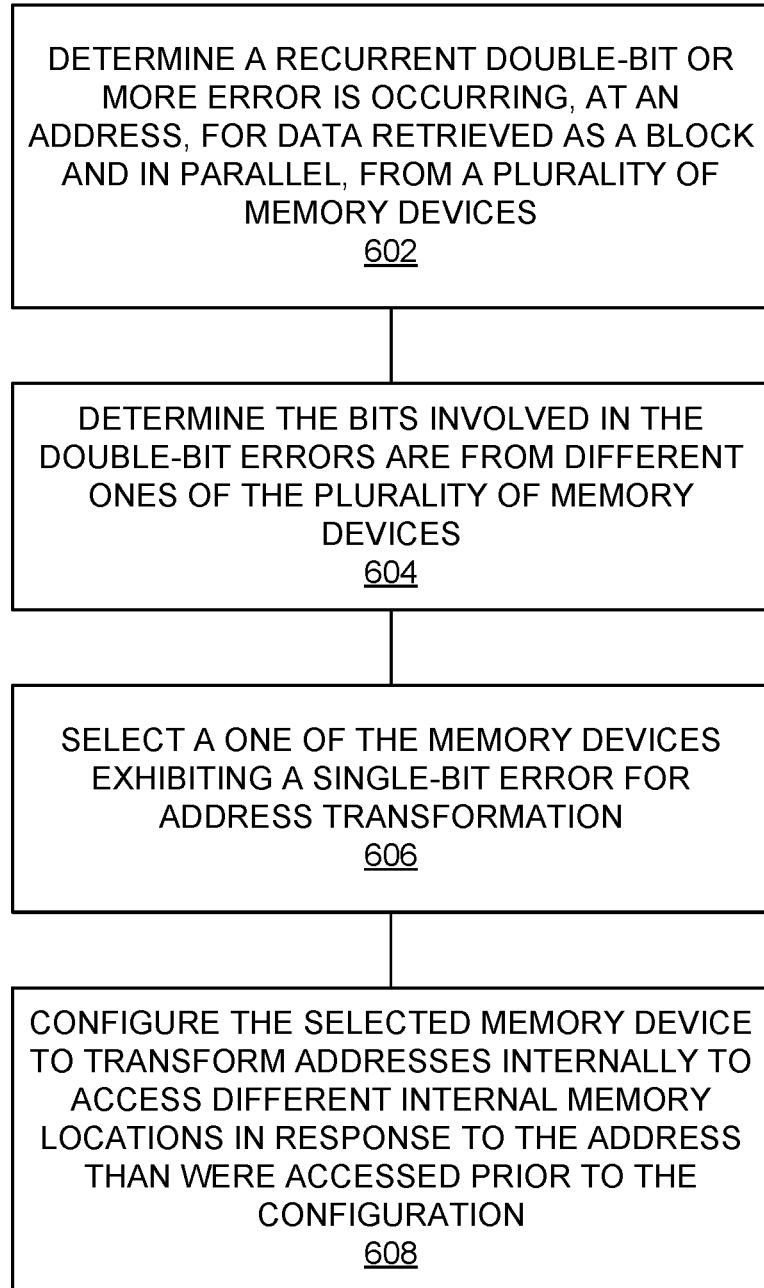
FIG. 6 is a flowchart illustrating a method of remapping a double-bit error into correctable single-bit errors.

FIG. 6 is a flowchart illustrating a method of remapping a double-bit error into correctable single-bit errors. The steps illustrated in FIG. 6 may be performed by one or more of memory system 100, memory system 300, and/or their components. It is determined that a recurrent double-bit error is occurring at an address (602). For example, controller 110 may determine, using EDC logic 111, that a double-bit error is repeatedly occurring at a given address when accessing module 120.

It is determined that the bits involved in the double-bit errors are from different ones of the plurality of memory devices (604). For example, by knowing which bits the errors are occurring in (or by iteratively searching for the recurring error bit device association/location using remapping of individual memory devices 121-124 one at a time), controller 110 may determine that each of the single-bit errors that comprise the double-bit (or more) reoccurring error come from different memory devices 121-129.

A one of the memory devices exhibiting a single-bit error is selected for address transformation (606). For example, controller 110 may select a first one of the devices associated with the double-bit error for address transformation.

The selected memory device is configured to transform addresses internally to access different internal memory locations in response to the address than were accessed prior to the configuration (608). For example, controller 110 may configure (e.g., using a side-channel) an address transform 140 to transform the address. This transformation causes the memory device configured to change received addresses to access different internal memory cells than are accessed by the other memory devices not configured to change received addresses. Thus, the changed internal addresses are configured to "move" one of the single-bit errors at the double-bit error address to a different address thereby reducing the number of erroneous bits at that address down to a correctable single-bit error.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of memory system 100, memory system 300, and/or transform circuitry 400, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 7:
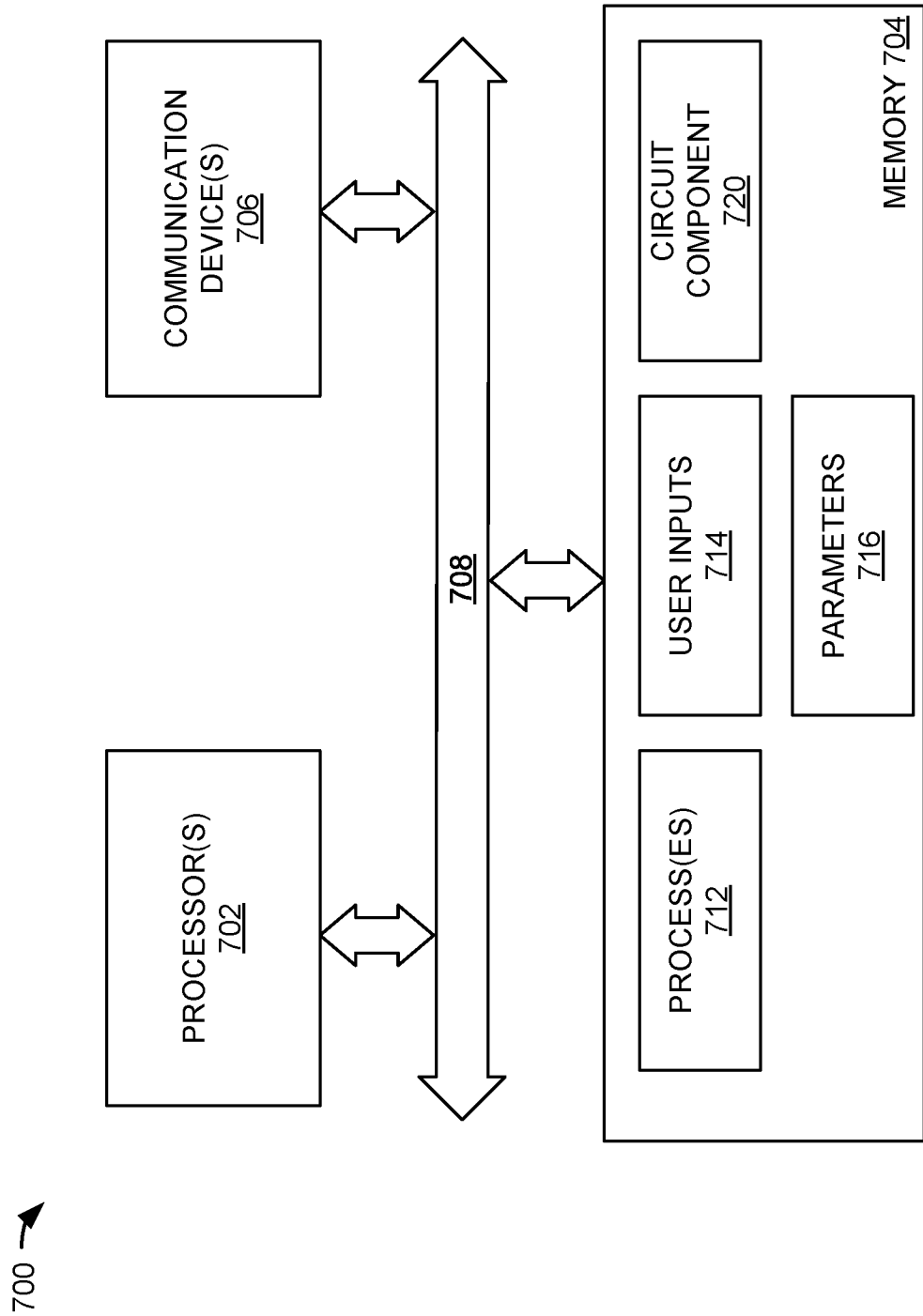
FIG. 7 is a block diagram of a processing system.

FIG. 7 is a block diagram illustrating one embodiment of a processing system 700 for including, processing, or generating, a representation of a circuit component 720. Processing system 700 includes one or more processors 702, a memory 704, and one or more communications devices 706. Processors 702, memory 704, and communications devices 706 communicate using any suitable type, number, and/or configuration of wired and/or wireless connections 708.

Processors 702 execute instructions of one or more processes 712 stored in a memory 704 to process and/or generate circuit component 720 responsive to user inputs 714 and parameters 716. Processes 712 may be any suitable electronic design automation (EDA) tool or portion thereof used to design, simulate, analyze, and/or verify electronic circuitry and/or generate photomasks for electronic circuitry. Representation 720 includes data that describes all or portions of memory system 100, memory system 300, and/or transform circuitry 400, as shown in the Figures.

Representation 720 may include one or more of behavioral, register transfer, logic component, transistor, and layout geometry-level descriptions. Moreover, representation 720 may be stored on storage media or communicated by carrier waves.

Data formats in which representation 720 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 714 may comprise input parameters from a keyboard, mouse, voice recognition interface, microphone and speakers, graphical display, touch screen, or other type of user interface device. This user interface may be distributed among multiple interface devices. Parameters 716 may include specifications and/or characteristics that are input to help define representation 720. For example, parameters 716 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 704 includes any suitable type, number, and/or configuration of non-transitory computer-readable storage media that stores processes 712, user inputs 714, parameters 716, and circuit component 720.

Communications devices 706 include any suitable type, number, and/or configuration of wired and/or wireless devices that transmit information from processing system 700 to another processing or storage system (not shown) and/or receive information from another processing or storage system (not shown). For example, communications devices 706 may transmit circuit component 720 to another system. Communications devices 706 may receive processes 712, user inputs 714, parameters 716, and/or circuit component 720 and cause processes 712, user inputs 714, parameters 716, and/or circuit component 720 to be stored in memory 704.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A device for controlling memory, comprising:
    error detection circuitry configured to determine, when data was retrieved from a plurality of memory devices using a first address that accesses first internal memory cells associated with the first address, that at least two single bit errors occurred in the data, and to determine that the at least two single bit errors occurred in respective subsets of the data retrieved from different ones of the plurality of memory devices; and,
    remapping control circuitry to configure at least one address transformation when the first address is accessed such that at least one of the plurality of memory devices accesses the first internal memory cells associated with the first address when the first address is accessed, and at least one of the different ones of the plurality of memory devices accesses second internal memory cells associated with a second address that is different from the first address when the first address is accessed.

2. The device of claim 1, wherein the at least one address transformation includes an inversion of at least one address bit.

3. The device of claim 2, wherein the inversion of at least one address bit is performed by the device.

4. The device of claim 2, wherein the device configures a registering clock driver to perform the inversion of the at least one address bit.

5. The device of claim 4, wherein the device configures the registering clock driver to perform the inversion of the at least one address bit by storing a value in a register of the registering clock driver.

6. The device of claim 2, wherein the device configures at least one of the plurality of memory devices to perform the inversion of the at least one address bit.

7. The device of claim 2, wherein the device configures the at least one of the plurality of memory devices to perform the inversion of the at least one address bit by storing a value in a register of the at least one of the plurality of memory devices.

* * * * *